(12) United States Patent
Meyer et al.

(10) Patent No.: US 12,104,275 B2
(45) Date of Patent: Oct. 1, 2024

(54) INGOT PULLER APPARATUS HAVING COOLING JACKET DEVICE WITH COOLING FLUID TUBES

(71) Applicant: GlobalWafers Co., Ltd., Hsinchu (TW)

(72) Inventors: Benjamin Michael Meyer, Defiance, MO (US); Justin Scott Kayser, Wentzville, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 149 days.

(21) Appl. No.: 17/878,794

(22) Filed: Aug. 1, 2022

(65) Prior Publication Data
US 2024/0035193 A1 Feb. 1, 2024

(51) Int. Cl.
*C30B 35/00* (2006.01)
*C30B 15/10* (2006.01)

(52) U.S. Cl.
CPC .............. *C30B 15/10* (2013.01); *C30B 35/00* (2013.01); *C30B 35/002* (2013.01)

(58) Field of Classification Search
CPC ......... C30B 15/00; C30B 15/10; C30B 15/14; C30B 15/20; C30B 29/00; C30B 29/02; C30B 29/06; C30B 25/00
USPC .......... 117/11, 13, 200, 204, 206, 208, 217, 928, 117/931–932
See application file for complete search history.

(56) References Cited

U.S. PATENT DOCUMENTS

| | | | |
|---|---|---|---|
| 6,899,758 B2 | 5/2005 | Abe et al. | |
| 2002/0100410 A1* | 8/2002 | Kim | C30B 15/203 117/13 |
| 2016/0017514 A1* | 1/2016 | Lee | C30B 15/206 117/217 |

FOREIGN PATENT DOCUMENTS

| | | | |
|---|---|---|---|
| CN | 204325547 U | 5/2015 | |
| JP | 4259285 B2 * | 4/2009 | |

* cited by examiner

*Primary Examiner* — Kenneth A Bratland, Jr.
(74) *Attorney, Agent, or Firm* — Armstrong Teasdale LLP (57) ABSTRACT

Cooling jacket devices of ingot puller apparatus used to prepare silicon ingots by the Czochralski method are disclosed. The cooling jacket device may include an inner shell that forms an inner chamber through which the ingot is pulled. The cooling jacket includes an outer shell. A plurality of tubes are disposed between the inner shell and outer shell. Each tube forms a cooling fluid passageway through which cooling fluid passes.

20 Claims, 11 Drawing Sheets

INGOT PULLER APPARATUS HAVING COOLING JACKET DEVICE WITH COOLING FLUID TUBES

FIELD OF THE DISCLOSURE

The field of the disclosure relates to cooling jacket devices of ingot puller apparatus used to prepare silicon ingots by the Czochralski method.

BACKGROUND

Ingot puller apparatus in which a silicon ingot is pulled from a silicon melt by the Czochralski method (batch or continuous) may use a cooling jacket device which shrouds the ingot as the ingot is pulled through the ingot puller. The cooling jacket device removes heat from the ingot which helps achieve a desirable temperature gradient within the ingot.

Conventional cooling jacket devices may include baffles to direct the cooling fluid about the cooling device jacket. Because the outer skin of the jacket encloses the baffles resulting in limited or no access to the baffles, it is difficult and, for some baffles, impossible to weld the outer shell of the jacket to the baffles. Because the outer shell is not sealed to the baffles, cooling fluid may flow through gaps between the baffle and the outer shell (i.e., in a "blow-by" condition in which cooling fluid passes over the baffle from a high pressure channel to a lower pressure channel). This leads to reduced cooling of the ingot and reduces the efficiency of the cooling jacket device. A need exists for cooling jacket devices which reduce or eliminate blow-by.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an ingot puller apparatus for manufacturing a single crystal silicon ingot. The ingot puller apparatus has a pull axis and includes an ingot puller housing that defines a growth chamber for pulling a silicon ingot from a melt. The ingot puller apparatus includes a crucible assembly for holding a silicon melt. The crucible assembly is disposed within the growth chamber. A cooling jacket device is disposed within the growth chamber. The cooling jacket device includes an inner shell, an outer shell, and a plurality of tubes disposed between the inner shell and outer shell. The inner shell forms an inner chamber through which the ingot is pulled. Each tube has a longitudinal axis that is parallel to the pull axis. Each tube forms a cooling fluid passageway through which cooling fluid passes.

Yet another aspect of the present disclosure is directed to an ingot puller apparatus for manufacturing a single crystal silicon ingot. The ingot puller apparatus has a pull axis and includes an ingot puller housing that defines a growth chamber for pulling a silicon ingot from a melt. The ingot puller apparatus includes a crucible assembly for holding a silicon melt. The crucible assembly is disposed within the growth chamber. A cooling jacket device is disposed within the growth chamber. The cooling jacket device includes an inner shell, outer shell, and a plurality of tubes disposed between the inner shell and outer shell. The inner shell forms an inner chamber through which the ingot is pulled. Each tube has an inlet and an outlet. The outlet is disposed below the inlet relative to the pull axis.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
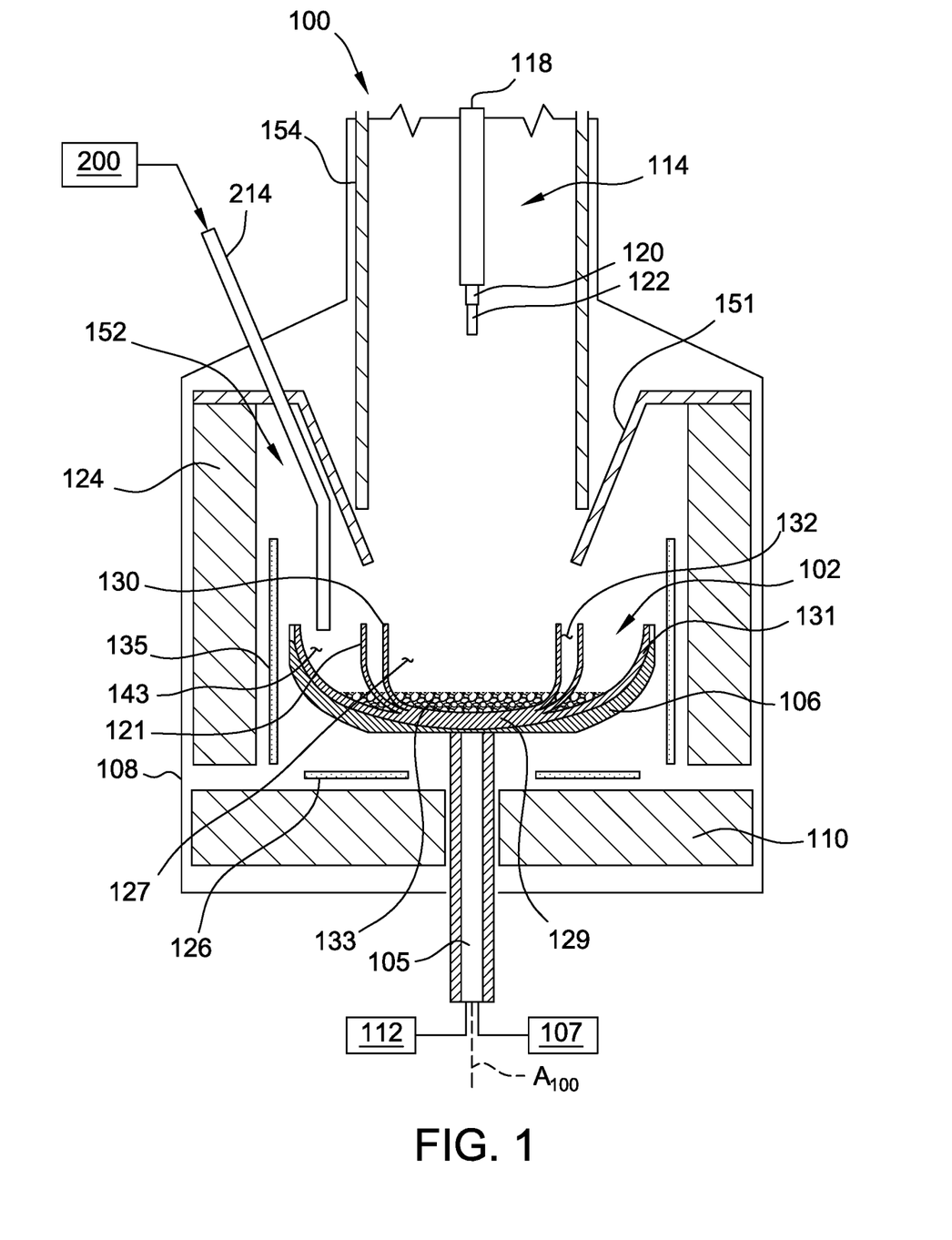
FIG. 1 is a cross-section of an example ingot puller apparatus with a silicon charge disposed in the crucible assembly.
Figure 2:
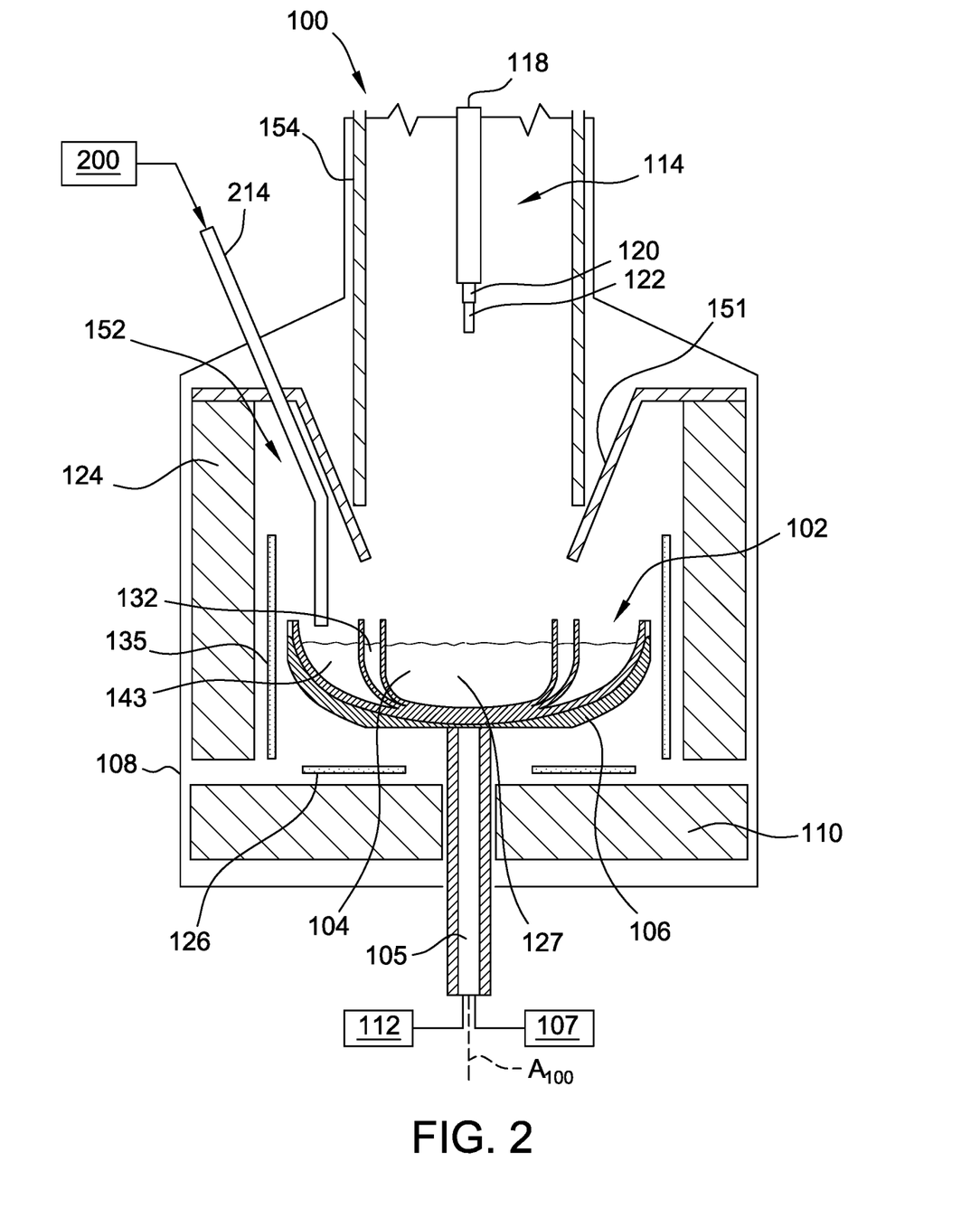
FIG. 2 is a cross-section of the ingot puller apparatus after melt-down.

Provisions of the present disclosure relate to cooling jacket devices of ingot puller apparatus that are used to cool a silicon ingot grown by the Czochralski process. An example ingot puller apparatus (or more simply "ingot puller") is indicated generally at "100" in FIG. 1. The ingot puller apparatus 100 includes a crucible assembly 102 for holding a melt 104 (FIG. 2) of semiconductor or solar-grade material silicon. The crucible assembly 102 is supported by a susceptor 106. The ingot puller apparatus 100 includes an ingot puller housing 108 that defines a growth chamber 152 for pulling a silicon ingot 113 (FIG. 4) from the melt 104 along a pull axis $A_{100}$.

The illustrated ingot puller apparatus 100 is suited for continuous Czochralski processes in which solid silicon is added to the crucible assembly 102 continuously or intermittently. In other embodiments, a batch Czochralski process may be used when an initial charge of silicon is added to the crucible assembly 102 (typically an assembly without fluid barriers 121, 130) and melted without additional silicon being added to the crucible assembly during ingot growth.

The cooling jacket device described below may be used in continuous Czochralski systems or in batch systems.

The illustrated crucible assembly 102 has a sidewall 131 (FIG. 1) and one or more fluid barriers 121, 130 or "weirs" that separate the melt into different melt zones. In the illustrated embodiment, the crucible assembly 102 includes a first weir 121. The first weir 121 and sidewall 131 define an outer melt zone 143 (FIG. 2) of the silicon melt 104 and the crucible assembly 102. The crucible assembly 102 includes a second weir 130 radially inward to the first weir 121 which defines an inner melt zone 127 of the silicon melt 104 and crucible assembly 102. The inner melt zone 127 is the growth region from which the single crystal silicon ingot 113 (FIG. 4) is grown. The first weir 121 and the second weir 130 define a middle melt zone 132 of the crucible assembly 102 and silicon melt 104 in which the melt 104 may stabilize as it moves toward the inner melt zone 127. The first and second weirs 121, 130 each have at least one opening formed therein to permit molten silicon to flow radially inward towards the inner melt zone 127. The crucible assembly configuration depicted in FIGS. 1-4 is exemplary. In other embodiments, the crucible assembly 102 does not have any fluid barriers (as in batch Czochralski).

The susceptor 106 is supported by a shaft 105. The susceptor 106, crucible assembly 102, shaft 105, and ingot 113 (FIG. 4) have a common longitudinal axis or "pull axis" A.

Figure 3:
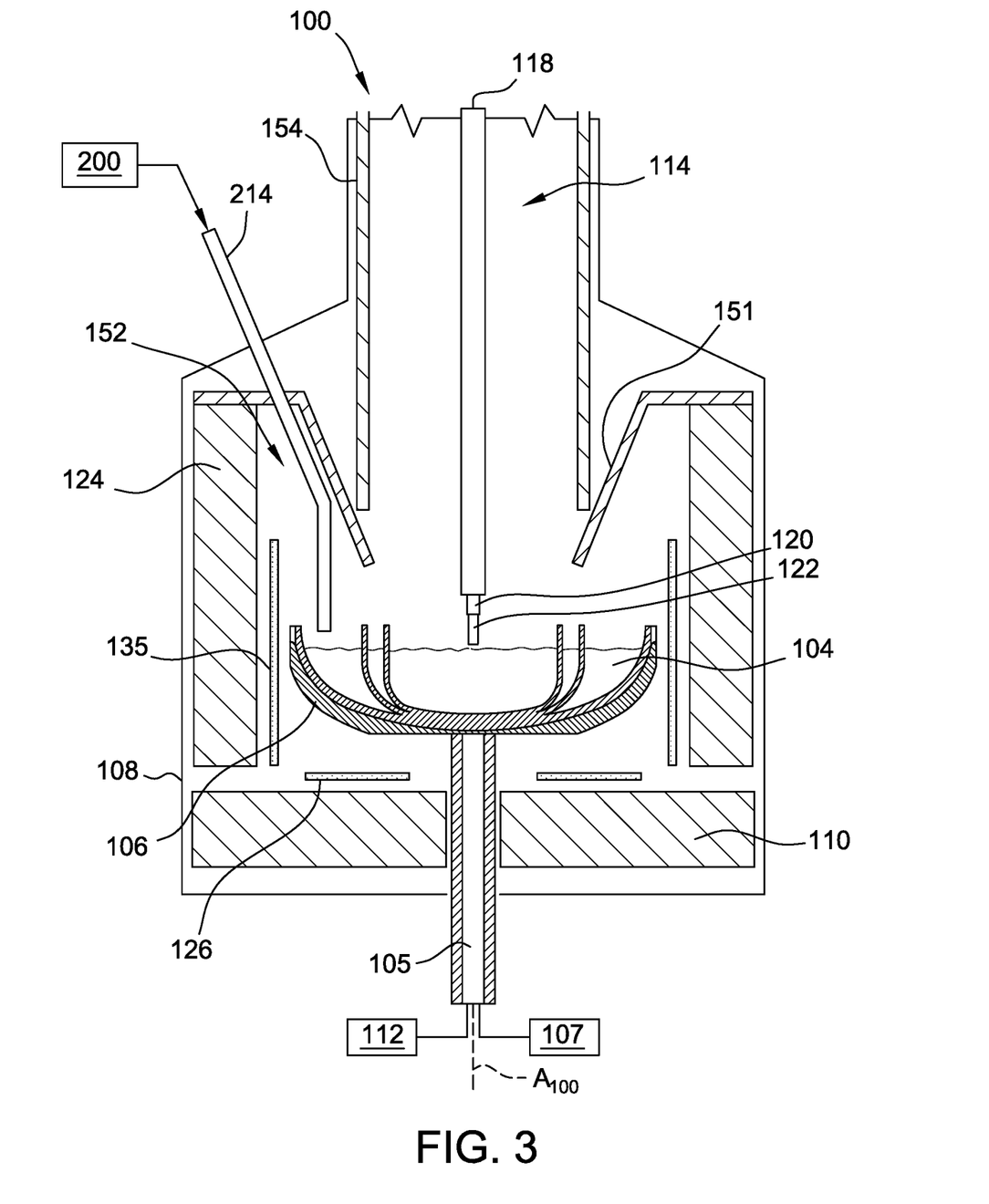
FIG. 3 is a cross-section of the ingot puller apparatus with the silicon seed crystal lowered to contact the melt.

A pulling mechanism 114 is provided within the ingot puller apparatus 100 for growing and pulling an ingot 113 (FIG. 4) from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the surface of the melt 104 (FIG. 3). The pulling mechanism 114 is operated to cause the seed crystal 122 to rise. This causes a single crystal ingot 113 (FIG. 4) to be pulled from the melt 104.

During heating and crystal pulling, a crucible drive unit 107 (e.g., a motor) rotates the crucible assembly 102 and susceptor 106. A lift mechanism 112 raises and lowers the crucible assembly 102 along the pull axis $A_{100}$ during the growth process. For example, the crucible assembly 102 may be at a lowest position (near the bottom heater 126) in which a charge of solid-phase polycrystalline silicon 133 previously added to the crucible assembly 102 is melted. Crystal growth commences by contacting the melt 104 (FIG. 3) with the seed crystal 122 and lifting the seed crystal 122 by the pulling mechanism 114. As the ingot 113 (FIG. 4) grows, the silicon melt 104 is consumed. In continuous Czochralski methods, the silicon melt 104 is replenished by adding solid-silicon through silicon feed tube 214. In batch methods, the height of the melt in the crucible assembly 102 decreases. The crucible assembly 102 and susceptor 106 may be raised to maintain the melt surface 111 at or near the same position relative to the ingot puller apparatus 100.

A crystal drive unit (not shown) may also rotate the pulling cable 118 and ingot 113 (FIG. 4) in a direction opposite the direction in which the crucible drive unit 107 rotates the crucible assembly 102 (e.g., counter-rotation). In embodiments using iso-rotation, the crystal drive unit may rotate the pulling cable 118 in the same direction in which crucible drive unit 107 rotates the crucible assembly 102.

According to the Czochralski single crystal growth process, a quantity of solid-phase silicon 133 (FIG. 1) such as polycrystalline silicon, or polysilicon, is charged to the crucible assembly 102. The semiconductor or solar-grade material that is introduced into the crucible assembly 102 is melted by heat provided from one or more heating elements. The size of the solid-phase silicon charge 133 may correspond to the desired size of the melt when ingot growth commences or, as in other embodiments, a smaller charge is used and additional silicon is added by a silicon feed system 200 to form the initial volume of melt present during initiation of ingot growth.

The ingot puller apparatus 100 includes bottom insulation 110 and side insulation 124 to retain heat in the ingot puller apparatus 100. In the illustrated embodiment, the ingot puller apparatus 100 includes a bottom heater 126 disposed below the crucible floor 129. The crucible assembly 102 may be moved to be in relatively close proximity to the bottom heater 126 to melt the polycrystalline charged to the crucible assembly 102.

Figure 4:
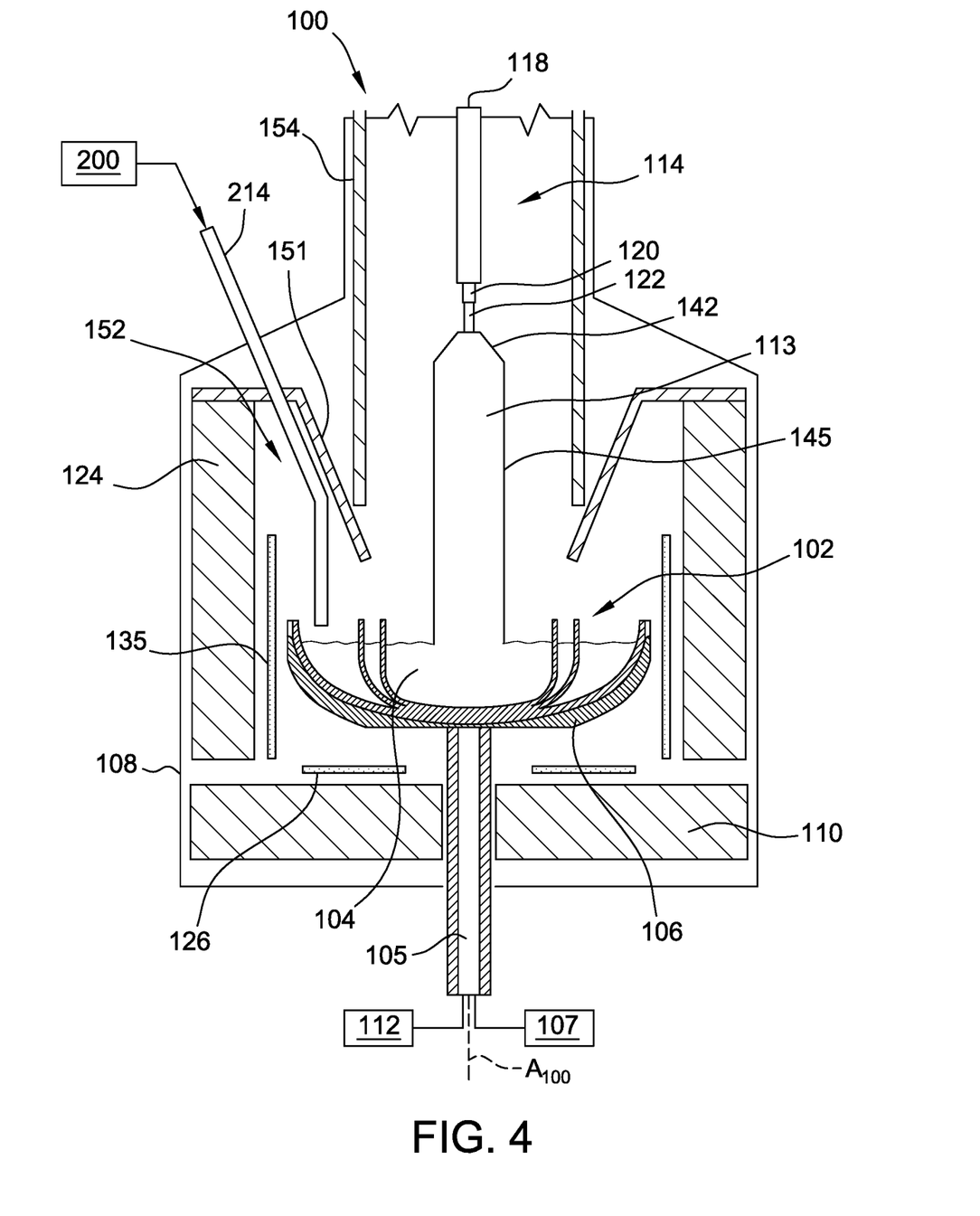
FIG. 4 is a cross-section of the ingot puller apparatus during the ingot growth phase.

To form the ingot, after the melt is stabilized, the seed crystal 122 is contacted with the surface 111 of the melt 104 as shown in FIG. 3. The pulling mechanism 114 is operated to pull the seed crystal 122 from the melt 104. Referring now to FIG. 4, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 includes a side heater 135 and a susceptor 106 that encircles the crucible assembly 102 to maintain the temperature of the melt 104 during crystal growth. The side heater 135 is disposed radially outward to the crucible sidewall 131 as the crucible assembly 102 travels up and down the pull axis $A_{100}$. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a reflector or "heat shield" 151. The heat shield 151 may shroud the ingot 113 during crystal growth (FIG. 4). A cooling jacket device 154, which is described more fully below, is disposed within the growth chamber 152 and is, at least partially, radially inward of the heat shield 151. The ingot puller apparatus 100 may include an inert gas system to introduce and withdraw an inert gas such as argon from the growth chamber 152. In some embodiments, argon gas may also be introduced through the cooing jacket 154 as the sole argon source or a secondary source.

The ingot puller apparatus 100 also includes a silicon feed system 200 for introducing solid-state silicon (e.g., polycrystalline silicon or single crystal silicon scrap material) into the crucible assembly 102 and, in particular, the outer melt zone 143. The solid-state silicon may be added continuously during ingot growth to maintain a substantially constant melt elevation level and volume during growth of the ingot 113 or may be added intermittently between crystals. The solid silicon that is fed to the crucible assembly 102 by the silicon feed system 200 may be, for example, granular, chunk, chip, or a combination of thereof. The silicon feed system 200 adds or meters solid-state silicon into and through a silicon feed tube 214.

Figure 5:
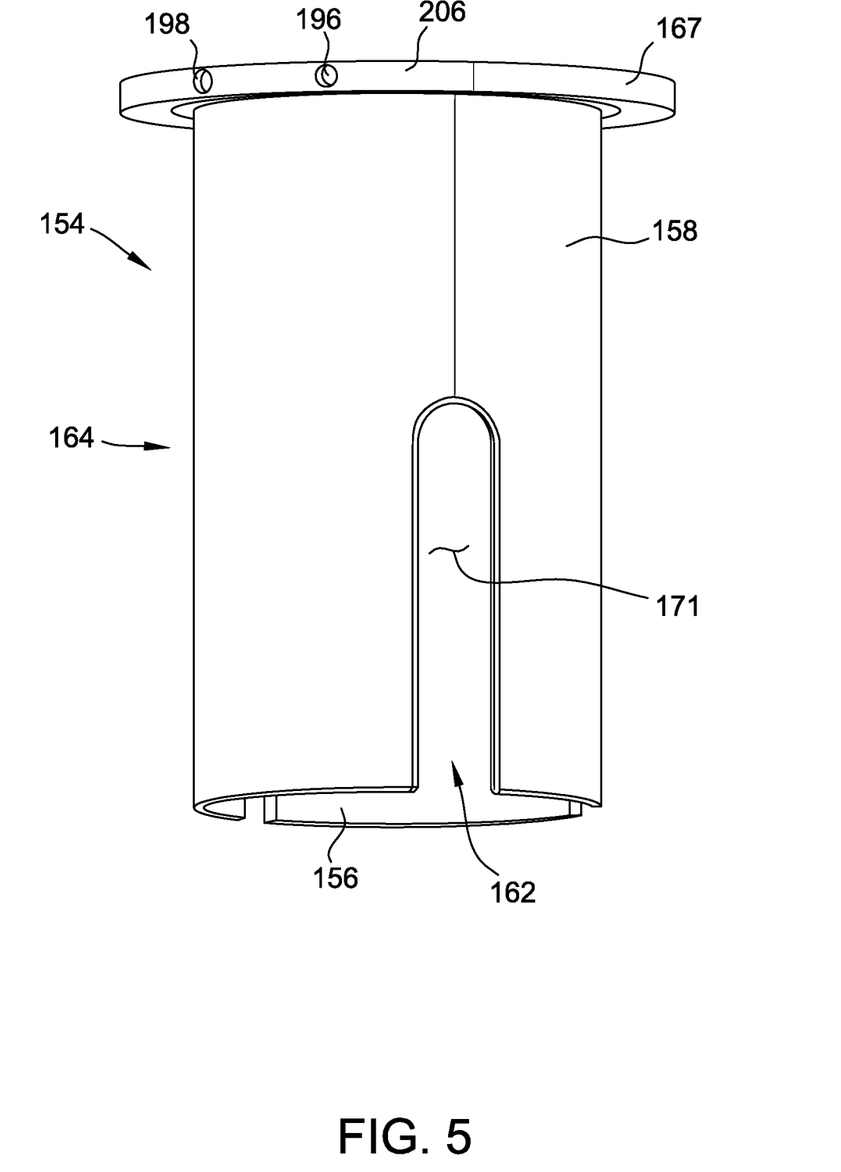
FIG. 5 is a perspective view of a cooling jacket device of the ingot puller apparatus.
Figure 11:
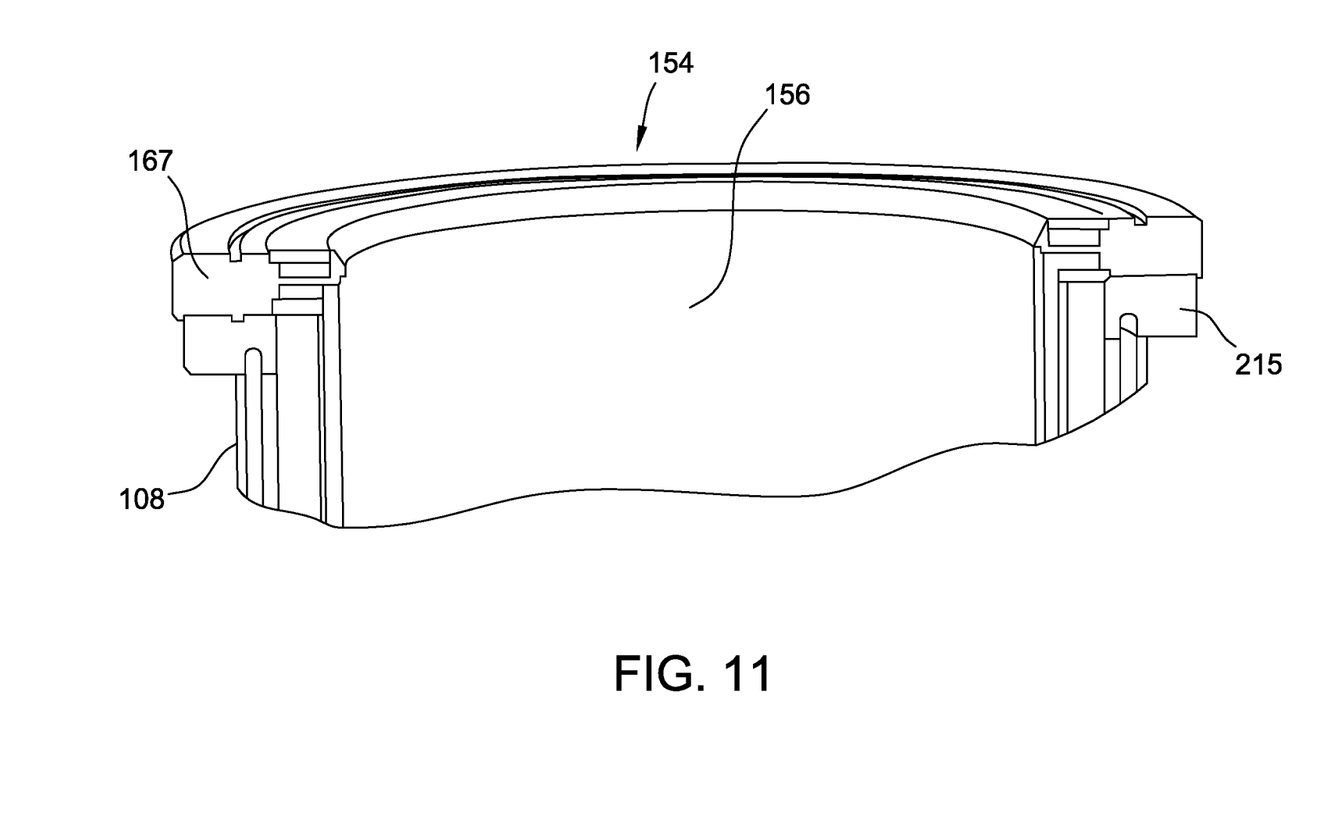
FIG. 11 is a cross-section perspective of the cooling jacket device and a lower chamber flange of the ingot puller housing.

Referring now to FIG. 5, an embodiment of a cooling jacket device 154 (which may also be referred to herein more simply as a "cooling jacket") is shown. The cooling jacket device 154 includes a main portion 164 and a flange 167 that extends from the main portion 164. The flange 167 is disposed on a lower chamber flange 215 (FIG. 11) of the ingot puller housing 108. The lower chamber flange 215 may connect to an upper chamber (not shown) of the ingot puller apparatus through which the ingot is pulled. The cooling jacket flange 167 may be connected to the lower chamber flange 215 by fasteners such as bolts and nuts.

Figure 6:
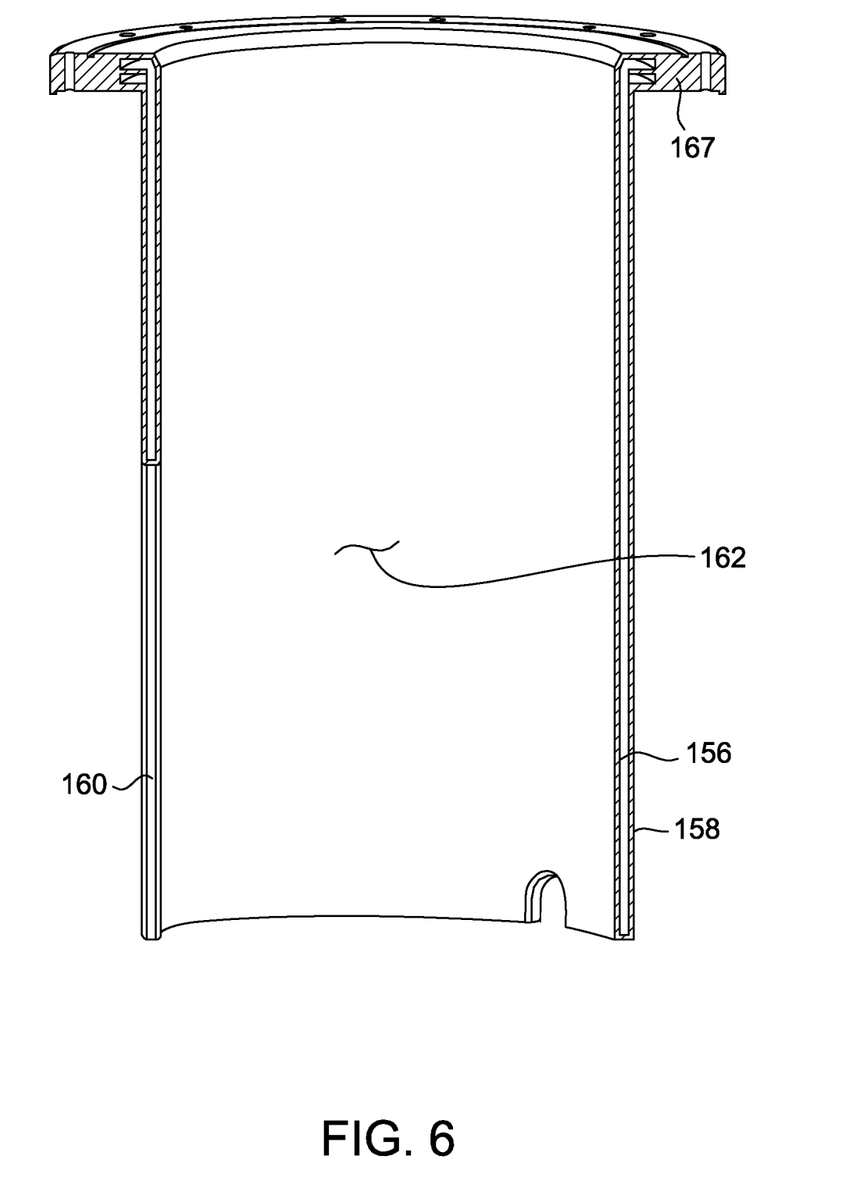
FIG. 6 is a cross-section perspective view of the cooling jacket device.

The main portion 164 of the cooling jacket device 154 includes an inner shell 156 and an outer shell 158. The inner shell 156 and outer shell 158 are separated by a gap and form a cooling water chamber 160 (FIG. 6) between the inner shell 156 and outer shell 158. The inner shell 156 of the cooling jacket device 154 forms an inner chamber 162 through which the ingot 113 is pulled.

Figure 7:
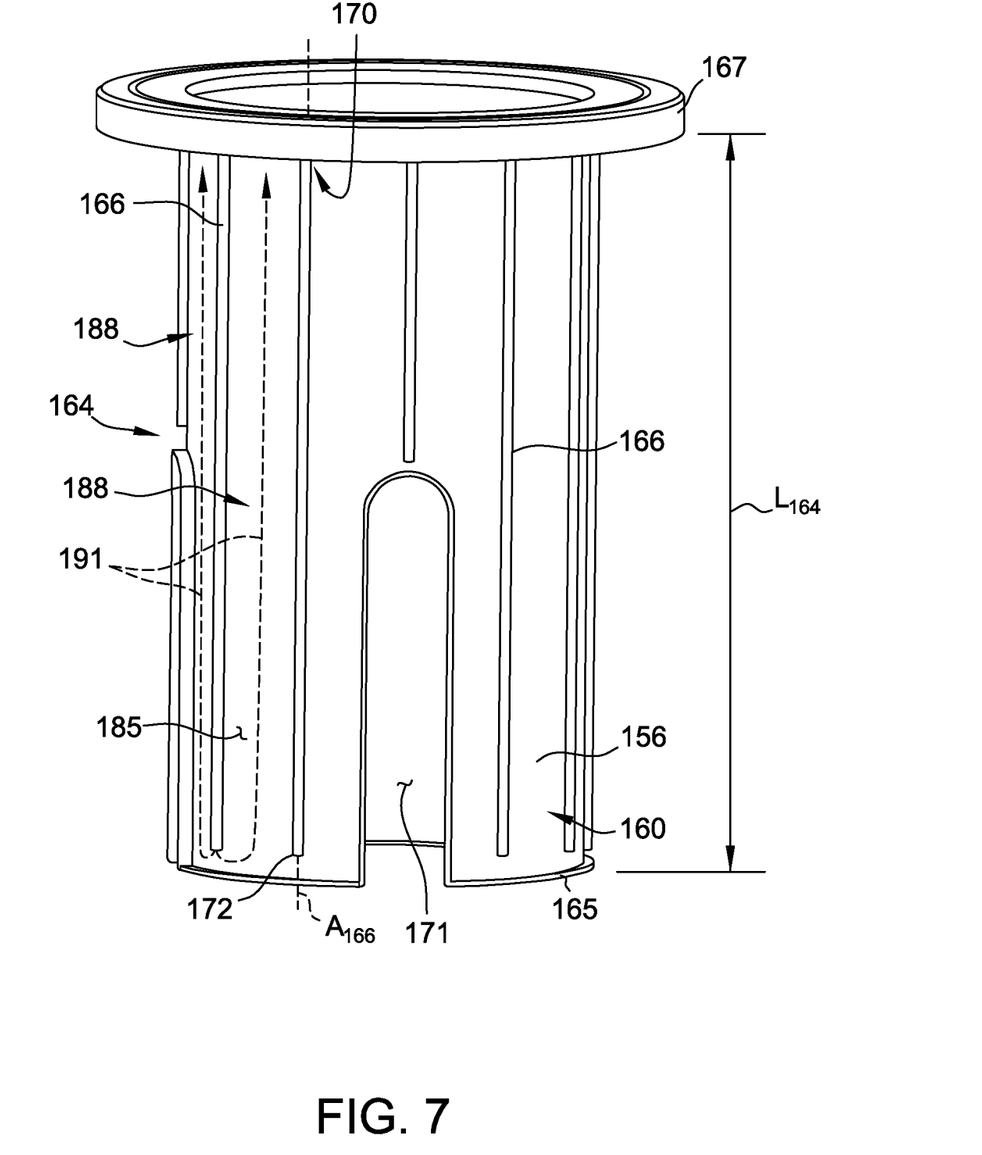
FIG. 7 is a perspective view of the cooling jacket device with the outer shell removed.

Referring now to FIG. 7, a plurality of tubes 166 are disposed between the inner shell 156 and the outer shell 158 (FIG. 5) in the colling water chamber 160. Each tube 166 forms a fluid passageway 175 (FIG. 8) through which cooling fluid passes. Each tube 166 includes an inlet 170 and an outlet 172 and has a longitudinal axis $A_{166}$. In the illustrated embodiments, the longitudinal axis $A_{166}$ is parallel to the pull axis $A_{100}$ of the ingot puller apparatus (i.e., is parallel when viewed from above). In other embodiments the longitudinal axis $A_{166}$ is not parallel to the pull axis $A_{100}$ (e.g., such as when the main portion 164 of the cooling jacket device 154 is cone shaped such as a 5° cone). The inlet 170 of each tube 166 is disposed above the outlet 172 relative to the pull axis $A_{100}$ and the longitudinal axis $A_{166}$ of the tube 166.

The tubes 166 each include a tube housing 180 (FIG. 8) which defines the cooling fluid passageway 175. In the illustrated embodiment, the housing 180 is separate from the inner shell 156 (FIG. 5) and the outer shell 158 (i.e., the inner shell 156 and outer shell 158 do not form a portion of the tube 166 that forms the fluid passageway 175). In other embodiments, one or both of the inner shell 156 and outer shell 158 forms a wall of the tube housing 180.

Each tube 166 extends from the inner shell 156 to the outer shell 158 (i.e., across the entire gap between the inner shell 156 to the outer shell 158). In some instances there may be a gap between the tubes 166 and the inner or outer shell 156, 158 (e.g., due to manufacturing tolerances or the like). In some embodiments, the tubes 166 contact the outer shell 158 but are not attached to the outer shell (e.g., by welding). In some embodiments, the tubes 166 are attached to the inner shell 156 (such as by welding) but are not attached (e.g., such as by welding) to the outer shell 158.

The tubes 166 extend along the length $L_{164}$ (FIG. 7) of the main body 164 and, in the illustrated embodiment, partially along the length $L_{164}$ (i.e., the outlet 172 is spaced from the bottom 165 of the main body 164) to allow cooling fluid to be discharged from the tube 166. For example, the tubes 166 may extend at least 50%, at least 75%, at least 90% or at least 95% of the length $L_{164}$ of the main body 164. Some tubes 166 such as tubes circumferentially aligned with cutouts 171 (FIG. 5) in the main body 164 may be relatively shorter than other tubes. Such cutouts 171 may be used to view the ingot during growth.

The tubes 166 may be relatively narrow. For example, the tubes have a length and a cross-section with a largest dimension (i.e., diameter when cylindrical tubes are used) with the ratio of the length to the largest dimension being at least 5:1. In other embodiments, the ratio of the length to the largest dimension is at least 10:1, at least 25:1 or at least 50:1. In some embodiments, the tubes 166 are straight-sided along their length.

Figure 8:
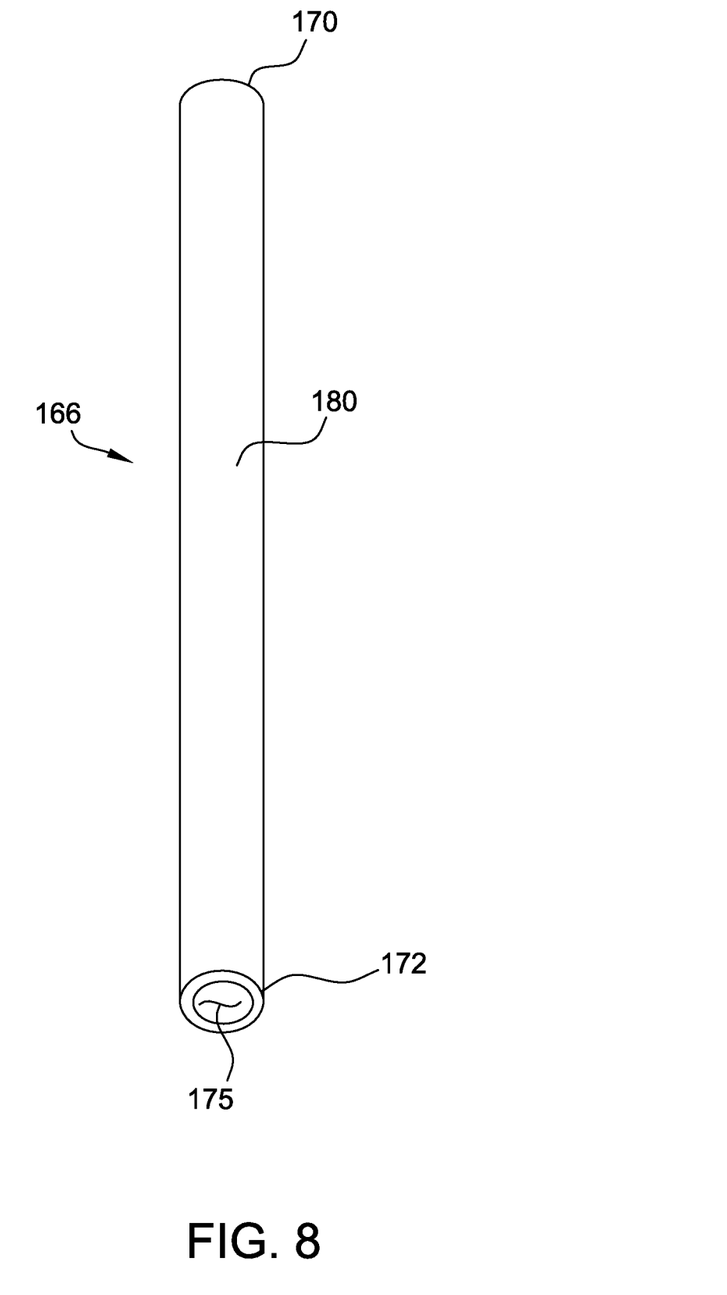
FIG. 8 is a front view of a tube of the cooling jacket device.

The illustrated tubes 166 do not have openings other than the inlet 170 and outlet 172 (FIG. 8). In other embodiments, the tubes 166 may include other openings formed in the tube housing 180 (e.g., to allow some fluid to exit the tube 166 along its length to eliminate dead spots within the cooling jacket device 154).

The cooling jacket device 154 may have any number of tubes 166 which allow the device 154 to function as described herein. For example, the cooling jacket device 154 may include at least 2, at least 3, at least 4, at least 5 or at least 8 tubes. The tubes 166 may have any suitable shape and, in some embodiments are cylindrical (i.e., circular in cross-section). The tubes 166 may have other shapes such as rectangular, square, triangular, or hexagonal cross-sections.

As shown in FIG. 7, adjacent tubes 166 form a cooling fluid return channel 188 that extends between the tubes 166. An example fluid path 191 is shown in FIG. 7. After exiting the outlet 172 of a tube 166, the fluid returns along an adjacent cooling fluid return channel 188 and moves toward the flange 167.

Figure 9:
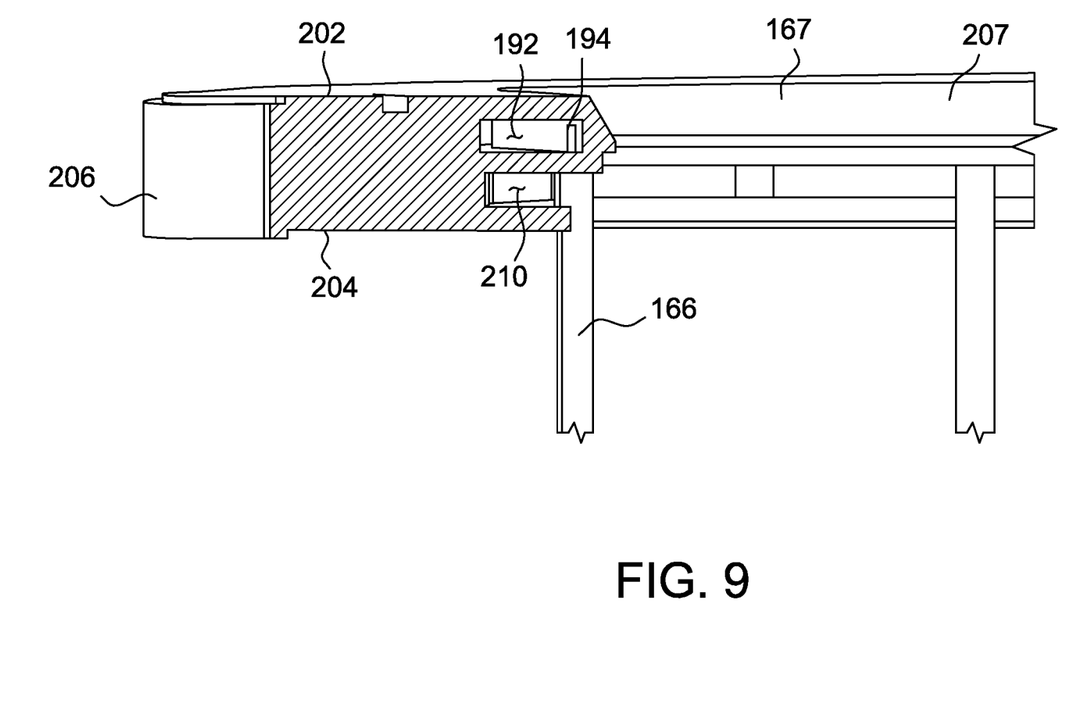
FIG. 9 is a cross-section view of a flange and tubes of the cooling jacket device.

Cooling fluid is introduced into the tubes 166 and removed from the return channels 188 through flange 167. The flange 167 is disposed above the main portion 164 of the cooling jacket device 154 and extends radially outward from the outer shell 158 (FIG. 5). As shown in FIG. 9, the flange 167 has an upper surface 202, a lower surface 204, outer and inner circumferential edges 206, 207 that each extend between the upper surface 202 and lower surface 204.

The flange 167 includes an inlet cooling fluid plenum 192. The plenum 192 has a plurality of outlets 194 with each outlet 194 being in fluid communication with a tube 166. Cooling fluid is introduced into the inlet cooling fluid plenum 192 through a cooling fluid inlet conduit 196 (FIG. 5). The cooling fluid inlet conduit 196 extends though the outer circumferential edge 206 of the flange 167 to the inlet cooling fluid plenum 192.

Figure 10:
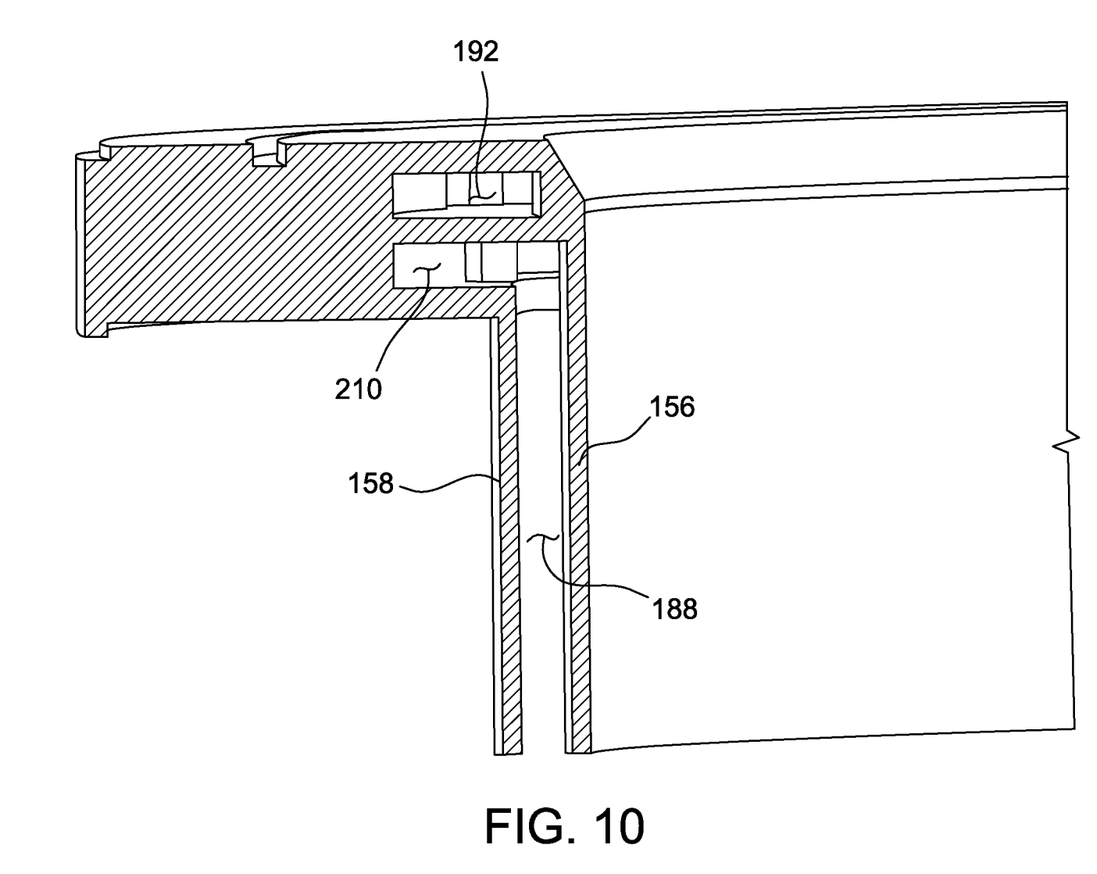
FIG. 10 is a cross-section view of a flange and the cooling fluid return channel of the cooling jacket device.

Referring now to FIG. 10, the flange 167 also includes a cooling fluid return plenum 210. The cooling fluid return channels 188 are in fluid communication with the cooling fluid return plenum 210. Cooling fluid exits the plenum 210 through a cooling fluid return conduit 198 (FIG. 5). The cooling fluid return conduit 198 extends though the outer circumferential edge 206 of the flange 167 to the cooling fluid return plenum 210.

During ingot growth, cooling fluid (e.g., water) is introduced into the cooling jacket device 154 through the cooling fluid inlet conduit 196 (FIG. 5). The fluid passes through the conduit 196 and into the inlet cooling fluid plenum 192. The fluid passes from the plenum 192 and into the inlet 170 of the tubes 166 (FIG. 7). The cooling fluid passes through the length of the tube 166 and passes through the outlet 172. The fluid enters a cooling fluid return channel 188 that is defined by adjacent tubes 166 and travels up the cooling jacket 154. As the cooling fluid moves upward through the fluid return channel 188, heat is transferred from the ingot, through the inner shell 156 and into the cooling fluid. The cooling fluid enters the cooling fluid return plenum 210 and flows through the cooling fluid return conduit 198. The fluid may be processed (e.g., cooling) and disposed of or recycled.

The cooling jacket device 154 may be made of any suitable material(s). In some embodiments, the cooling jacket device (e.g., flange, inner and outer shell, and tubes) are made of stainless steel.

Compared to conventional ingot puller apparatus, the ingot puller apparatus of the present disclosure have several advantages. Use of cooling fluid tubes which move cooling fluid toward the bottom of the jacket causes the cooling fluid pressure to be more consistent upon the return of cooling fluid in the return channels. More uniform pressure between channels prevents or reduces blow-by between channels. Use of tubes which extend a substantial length of the cooling jacket ensures fluid reaches the bottom portions of the jacket which increases cooling efficiency. The cooling jacket device is relatively easy to manufacture (and more cost effective) due to its simple deign relative to conventional cooling jacket devices which include baffles and involve additional welding. Less welding also reduces deformation of the cooling jacket device which results in a finished shape which better matches the design shape.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. An ingot puller apparatus for manufacturing a single crystal silicon ingot, the ingot puller apparatus having a pull axis and comprising:
   an ingot puller housing that defines a growth chamber for pulling a silicon ingot from a silicon melt;
   a crucible assembly for holding the silicon melt, the crucible assembly being disposed within the growth chamber;
   a cooling jacket device disposed within the growth chamber, the cooling jacket device comprising:
      an inner shell, the inner shell forming an inner chamber through which the silicon ingot is pulled;
      an outer shell; and
      a plurality of tubes disposed between the inner shell and outer shell, each tube of the plurality of tubes having a longitudinal axis that is parallel to the pull axis, each tube of the plurality of tubes forming a cooling fluid passageway through which cooling fluid passes,
      wherein adjacent tubes of the plurality of tubes form a cooling fluid return channel that extends between the adjacent tubes of the plurality of tubes.

2. The ingot puller apparatus as set forth in claim 1 wherein the plurality of tubes extend from the inner shell to the outer shell.

3. The ingot puller apparatus as set forth in claim 1 wherein the outer shell or inner shell does not form a wall of a tube of the plurality of tubes.

4. The ingot puller apparatus as set forth in claim 1 wherein the outer shell or inner shell does form a wall of a tube of the plurality of tubes.

5. The ingot puller apparatus as set forth in claim 1 comprising a heat shield, the cooling jacket device being, at least partially, radially inward to the heat shield.

6. The ingot puller apparatus as set forth in claim 1 wherein each tube of the plurality of tubes has a length and have a cross-section having a largest dimension, a ratio of the length to the largest dimension being at least 5:1.

7. The ingot puller apparatus as set forth in claim 1 wherein the plurality of tubes comprises at least 5 tubes.

8. The ingot puller apparatus as set forth in claim 1 wherein each tube of the plurality of tubes has a cross-section that is circular, rectangular, square, triangular, or hexagonal.

9. An ingot puller apparatus for manufacturing a single crystal silicon ingot, the ingot puller apparatus having a pull axis and comprising:
   an ingot puller housing that defines a growth chamber for pulling a silicon ingot from a silicon melt;
   a crucible assembly for holding the silicon melt, the crucible assembly being disposed within the growth chamber;
   a cooling jacket device disposed within the growth chamber, the cooling jacket device comprising:
      an inner shell, the inner shell forming an inner chamber through which the silicon ingot is pulled;
      an outer shell;
      a plurality of tubes disposed between the inner shell and outer shell, each tube of the plurality of tubes having a longitudinal axis that is parallel to the pull axis, each tube of the plurality of tubes forming a cooling fluid passageway through which cooling fluid passes; and
      a flange that extends radially outward from the outer shell, the flange forming an inlet cooling fluid plenum, the plurality of tubes being in fluid communication with the inlet cooling fluid plenum, the flange forming a cooling fluid return plenum,
      wherein adjacent tubes of the plurality of tubes form a cooling fluid return channel that extends between the adjacent tubes of the plurality of tubes, each cooling fluid return channel being in fluid communication with the cooling fluid return plenum.

10. The ingot puller apparatus as set forth in claim 9 wherein the ingot puller housing comprises a lower chamber flange, the flange of the cooling jacket device being disposed above and connected to the lower chamber flange.

11. The ingot puller apparatus as set forth in claim 9 wherein the plurality of tubes extend from the inner shell to the outer shell.

12. The ingot puller apparatus as set forth in claim 9 comprising a heat shield, the cooling jacket device being, at least partially, radially inward to the heat shield.

13. An ingot puller apparatus for manufacturing a single crystal silicon ingot, the ingot puller apparatus having a pull axis and comprising:
   an ingot puller housing that defines a growth chamber for pulling a silicon ingot from a silicon melt;

a crucible assembly for holding the silicon melt, the crucible assembly being disposed within the growth chamber;
a cooling jacket device disposed within the growth chamber, the cooling jacket device comprising:
an inner shell, the inner shell forming an inner chamber through which the silicon ingot is pulled;
an outer shell; and
a plurality of tubes disposed between the inner shell and outer shell, each tube of the plurality of tubes having an inlet and an outlet, the outlet being disposed below the inlet relative to the pull axis,
wherein adjacent tubes of the plurality of tubes form a cooling fluid return channel that extends between the adjacent tubes of the plurality of tubes.

14. The ingot puller apparatus as set forth in claim 13 wherein each tube of the plurality of tubes has a housing that forms a cooling fluid passageway through which cooling fluid passes, the housing being separate from and disposed between the inner shell and the outer shell.

15. The ingot puller apparatus as set forth in claim 13 wherein the cooling jacket device comprises a flange that extends radially outward from the outer shell, the flange forming an inlet cooling fluid plenum, the plurality of tubes being in fluid communication with the inlet cooling fluid plenum.

16. The ingot puller apparatus as set forth in claim 15 wherein the flange has an upper surface, a lower surface and an outer circumferential edge that extends between the upper surface and lower surface, the flange comprising a cooling fluid inlet conduit that extends though the outer circumferential edge to the inlet cooling fluid plenum.

17. The ingot puller apparatus as set forth in claim 15 wherein the ingot puller housing comprises a lower chamber flange, the flange of the cooling jacket device being disposed above and connected to the lower chamber flange.

18. An ingot puller apparatus for manufacturing a single crystal silicon ingot, the ingot puller apparatus having a pull axis and comprising:
an ingot puller housing that defines a growth chamber for pulling a silicon ingot from a silicon melt;
a crucible assembly for holding the silicon melt, the crucible assembly being disposed within the growth chamber;
a cooling jacket device disposed within the growth chamber, the cooling jacket device comprising:
an inner shell, the inner shell forming an inner chamber through which the silicon ingot is pulled;
an outer shell;
a plurality of tubes disposed between the inner shell and outer shell, each tube of the plurality of tubes having an inlet and an outlet, the outlet being disposed below the inlet relative to the pull axis; and
a flange that extends radially outward from the outer shell, the flange forming an inlet cooling fluid plenum, the plurality of tubes being in fluid communication with the inlet cooling fluid plenum, the flange forming a cooling fluid return plenum,
wherein adjacent tubes of the plurality of tubes form a cooling fluid return channel that extends between the adjacent tubes of the plurality of tubes, each cooling fluid return channel being in fluid communication with the cooling fluid return plenum.

19. The ingot puller apparatus as set forth in claim 18 wherein the flange has an upper surface, a lower surface and an outer circumferential edge that extends between the upper surface and lower surface, the flange comprising a cooling fluid return conduit that extends though the outer circumferential edge to the cooling fluid return plenum.

20. The ingot puller apparatus as set forth in claim 18 wherein the plurality of tubes comprises at least 5 tubes.

* * * * *